United States Patent
Sheng et al.

(10) Patent No.: US 7,019,315 B2
(45) Date of Patent: Mar. 28, 2006

(54) SYSTEM AND METHOD FOR SERIAL ION IMPLANTING PRODUCTIVITY ENHANCEMENTS

(75) Inventors: Alan P. Sheng, Gloucester, MA (US); Benjamin B. Riordon, Newburyport, MA (US); Lawrence M. Ficarra, Billerica, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/007,735

(22) Filed: Dec. 8, 2004

(65) Prior Publication Data

US 2005/0121627 A1    Jun. 9, 2005

Related U.S. Application Data

(60) Provisional application No. 60/527,977, filed on Dec. 8, 2003.

(51) Int. Cl.
*H01J 21/265*    (2006.01)

(52) U.S. Cl. .............................. 250/492.21; 250/442.11

(58) Field of Classification Search ........... 250/492.21, 250/442.11
See application file for complete search history.

(56) References Cited

U.S. PATENT DOCUMENTS 5,929,456 A * 7/1999 Tamai .................. 250/492.21

* cited by examiner

*Primary Examiner*—Kiet T. Nguyen

(57) ABSTRACT

An ion implantation apparatus is provided for workpiece handling. The apparatus includes a plurality of scan systems for scanning workpieces in an ion implanting beam, a plurality of exchangers for moving the workpieces to and from the scan systems, and a system controller for positioning one of the workpieces for scanning in the ion implanting beam by one of the scan systems, sensing completion of the ion beam scanning for the one workpiece and simultaneously positioning another of the workpieces for scanning in the ion implanting beam by another of the scan systems so that the workpieces are continuously presented to the ion implanting beam. The apparatus provides continuous implantation relative to the beam, thus enabling wafer exchange to occur in parallel with the implantation process. As a result, significant system productivity improvement and wafer throughput will be realized.

13 Claims, 5 Drawing Sheets

SYSTEM AND METHOD FOR SERIAL ION IMPLANTING PRODUCTIVITY ENHANCEMENTS

RELATED APPLICATIONS

This application claims priority under 35 U.S.C. § 119(e) to U.S. Provisional Patent Application Ser. No. 60/527,977, filed Dec. 8, 2003, entitled "System and Method for Serial Ion Implanting Productivity Enhancements," the disclosure of which is hereby incorporated by reference.

FIELD OF THE INVENTION

The described system and method relate generally to maximizing the beam on wafer time during serial ion implantation processing. More particularly, the described system and method are directed to maximizing the presence of a wafer in front of the beam path so that the utilization of the beam for implanting is maximized.

BACKGROUND OF THE INVENTION

The processing of semiconductor wafers involves processing tools for performing a large number of processing steps. The processing steps are usually performed in a vacuum chamber. The processing tools typically handle and process wafers one at a time in order to optimize control and reproducibility. These processing tools utilize automated wafer handling.

The throughput of processing tools is an important factor in achieving low cost manufacture. Ion implantation processing is one such processing step in which the efficiency of the wafer handling is critical to the overall wafer throughput. Wafer handling involves introduction of the wafers in a cassette or other wafer holder into the processing tool. The processing tool will typically remove the wafers from the cassette or other wafer holder and transport the wafers in the vacuum chamber, typically through a load lock, and then further transfers the wafers to a processing station. Upon completion of processing the wafers, the wafer handler will transport the wafers back to the cassette or wafer holders. Some of the processing and wafer handling operations may be performed concurrently to achieve efficient operation and high throughput. Careful design of wafer handling systems is required and a variety of wafer handling techniques are known in the prior art.

In one prior art system disclosed by Tamai in U.S. Pat. No. 5,929,456, a first group of wafers and a second group of wafers are rotated along first and second orbital paths intersecting a path of an ion beam during ion implantation processing. A wafer from each of the two groups is transferred to first and second wafer holders that respectively move the wafers on orbital paths CL1 and CL2 with at least a portion of the second orbital path being different from the first orbital path as shown in FIGS. 1A–1D of the Tamai patent. After one of the wafers completely traverses an ion beam radiation region 4, the wafer is transported upward as indicated by the broken lines in FIGS. 1B and 1D, while the other wafer traverses the radiation region. These processes are repeated until ion implantation of the two wafers is completed. Once the two wafers are implanted, two new wafers are transferred from load locks to replace the two implanted wafers on the wafer holders 50A and 50B. The two wafers are continuously rotated in front of the ion beam until the ion implantation processing is completed. Once the ion implantation processing is completed, the next set of unprocessed wafers replaces the processed wafers. These cycles are repeated until all of the wafers from the load lock are processed. However, this system suffers from relatively low wafer throughput because the ion beam is not fully utilized. During transfer of the sets of wafers, the beam is not being utilized for implanting into the wafer. Accordingly, there is a need for improved wafer handling systems which maximize the utilization and the time that ion beam is implanting onto the wafers or workpieces.

SUMMARY OF THE INVENTION

In serial implant ion implanters, the ion beam utilization is low. This is due to the presence of a wafer holding device, or platen, for processing (ion implanting) and wafer exchange. The time to exchange a processed wafer to an unprocessed wafer is in series with the implant process. The utilization of the ion beam on wafer is poor due to wafer exchange occurring in the critical path of the implantation process. This reduces the potential system throughput due to ion beam non-utilization during wafer exchange. The present invention is directed to utilizing a plurality of single wafer holding devices to approach continuous implantation relative to the beam, thus enabling wafer exchange to occur in parallel with the implantation process. As a result, significant system productivity improvement and wafer throughput will be realized.

According to a first aspect of the invention an ion implantation apparatus is provided for workpiece handling. The apparatus comprises a plurality of scan systems for scanning workpieces in an ion implanting beam, a plurality of exchangers for moving the workpieces to and from the scan systems, and a controller for positioning one of the workpieces for scanning in the ion implanting beam by one of the scan systems, sensing completion of processing for the one workpiece and simultaneously positioning another of the workpieces for scanning in the ion implanting beam by another of the scan systems so that the workpieces are continuously presented to the ion implanting beam.

BRIEF DESCRIPTION OF THE DRAWINGS

The embodiments of this invention will be described in detail, with reference to the following figures, wherein like designations denote like elements, and wherein.

DETAILED DESCRIPTION

Figure 1A:
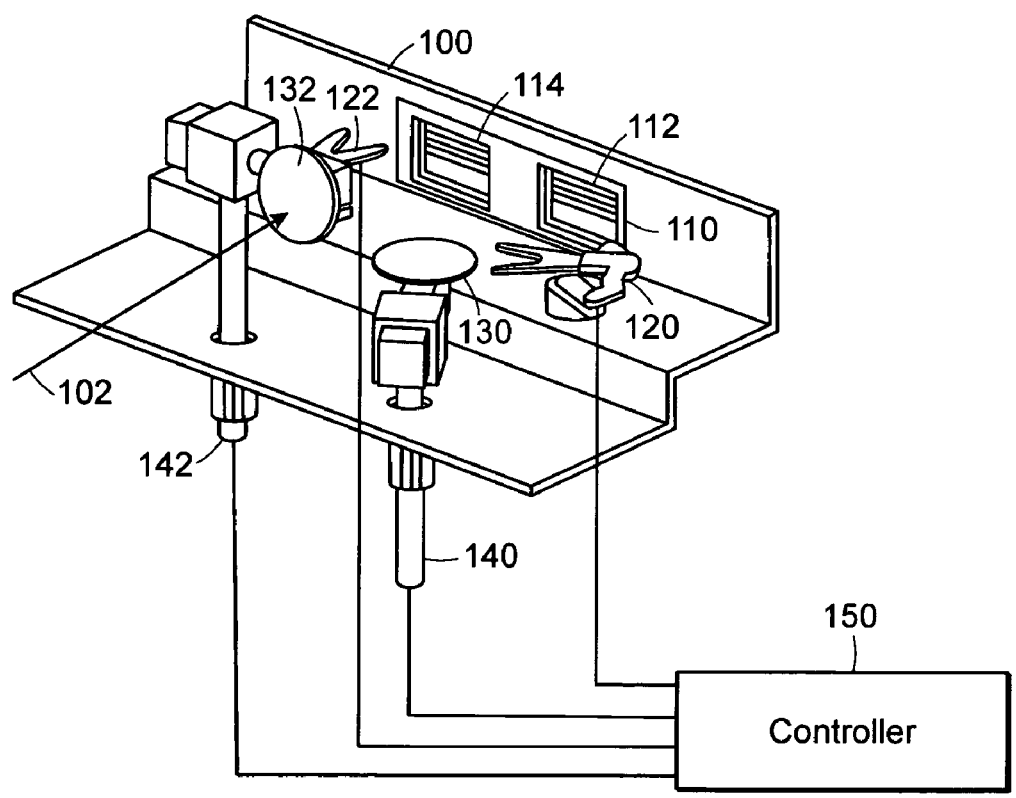
FIGS. 1(a)–1(g) show examples of a two platen serial ion implanter according to embodiments of the present invention.

According to the present invention, a system is provided for a high efficiency utilization of an ion beam while implanting semiconductor wafers. FIGS. 1(a)–1(g) illustrate examples of a system 100 for a two platen serial ion implanter according to an embodiment of the present invention. The system includes a load lock 110 for holding pass through cassettes of workpieces or wafers, which are passed from atmosphere (load area) to a vacuum area (implanting area) and then back after the ion implanting process is completed. First and second workpiece exchangers 120 and 122 are positioned between the load lock 110 and the first and second platens 130 and 132 for moving workpieces therebetween. The first and second workpiece exchangers 120 and 122 may be dual arm, multi-link or scara robots or the equivalent workpiece/wafer moving devices. In the present embodiment, the load lock 110 includes two load lock chambers 112 and 114 which are associated with the first and second platens 130 and 132. It should be realized by one skilled in the art that the number of load lock chambers may vary and is related to the complexity and sophistication of the first and second exchangers 120 and 122.

First and second scan systems 140 and 142 are associated with the first and second exchangers 120 and 122 respectively. The first and second scan systems 140 and 142 support platens 130 and 132 (also known as wafer holding devices) in which the first and second exchangers 120 and 122 exchange a processed workpiece with an unprocessed workpiece. The first and second scan systems 140 and 142 have a minimum of three axis, to allow the respective one of the first and second scan systems 140 and 142 to be rotated and translated up and down so that the workpiece may move through the transfer, queuing and implanting positions which will be described in more detail with respect to specific embodiments of the present invention. A system processor/controller 150 controls the movement of the workpieces between the first and second exchangers 120 and 122, the first and second scan systems 140 and 142 as well as the load lock 110. The ion beam 102 used for ion implantation may be a ribbon beam, a spot beam or the like as are known to those skilled in the art. The first and second scan systems 140 and 142 may scan the workpieces either horizontally, vertically or at predetermined angles relative to the ion beam 102 as desired for the particular implanting/processing application.

Figure 1B:
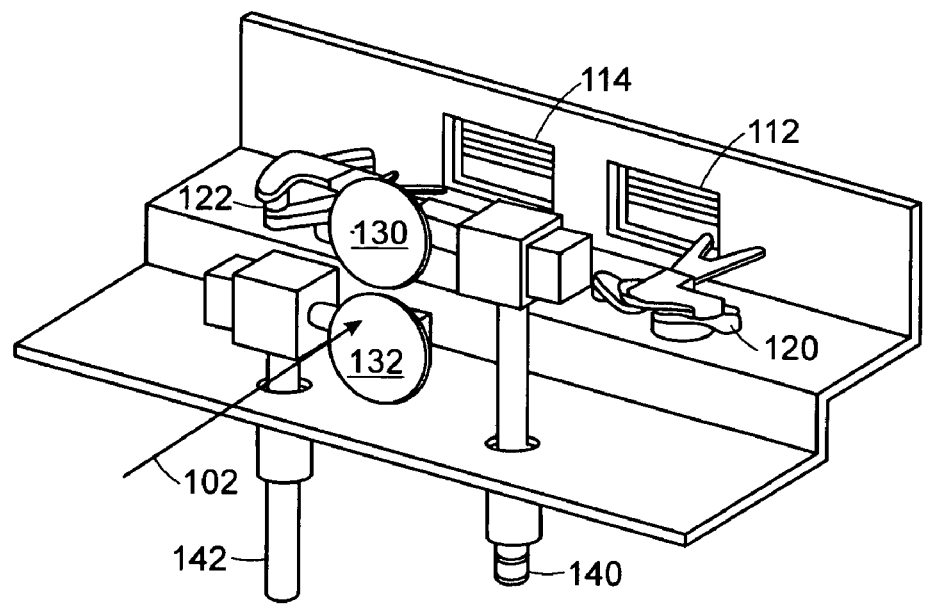
Figure 1C:
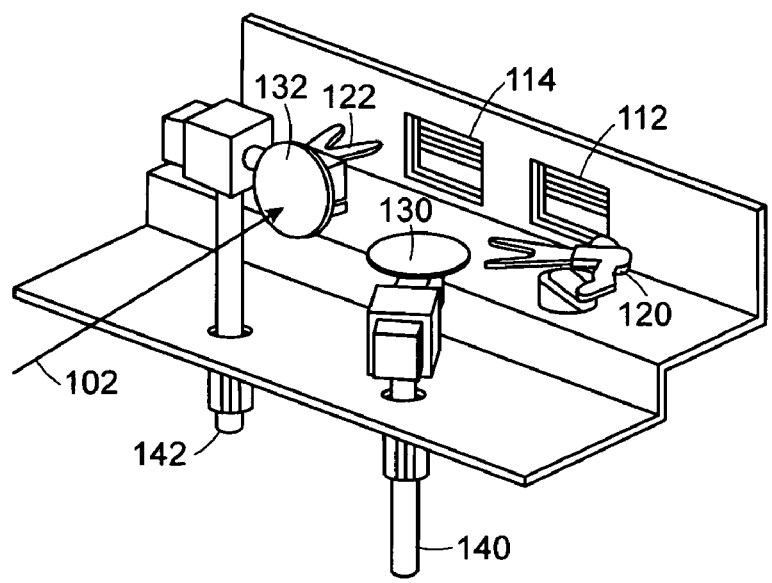
Figure 1D:
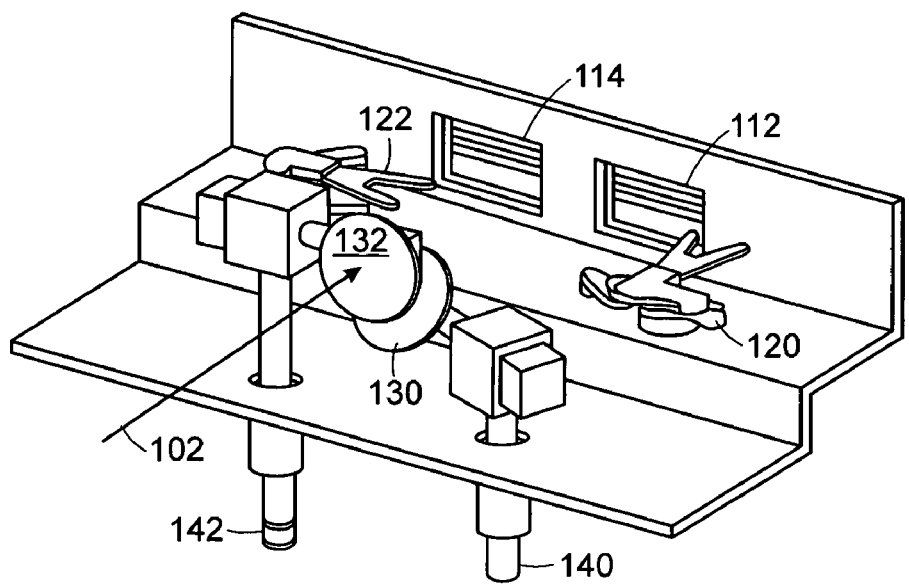
Figure 2:
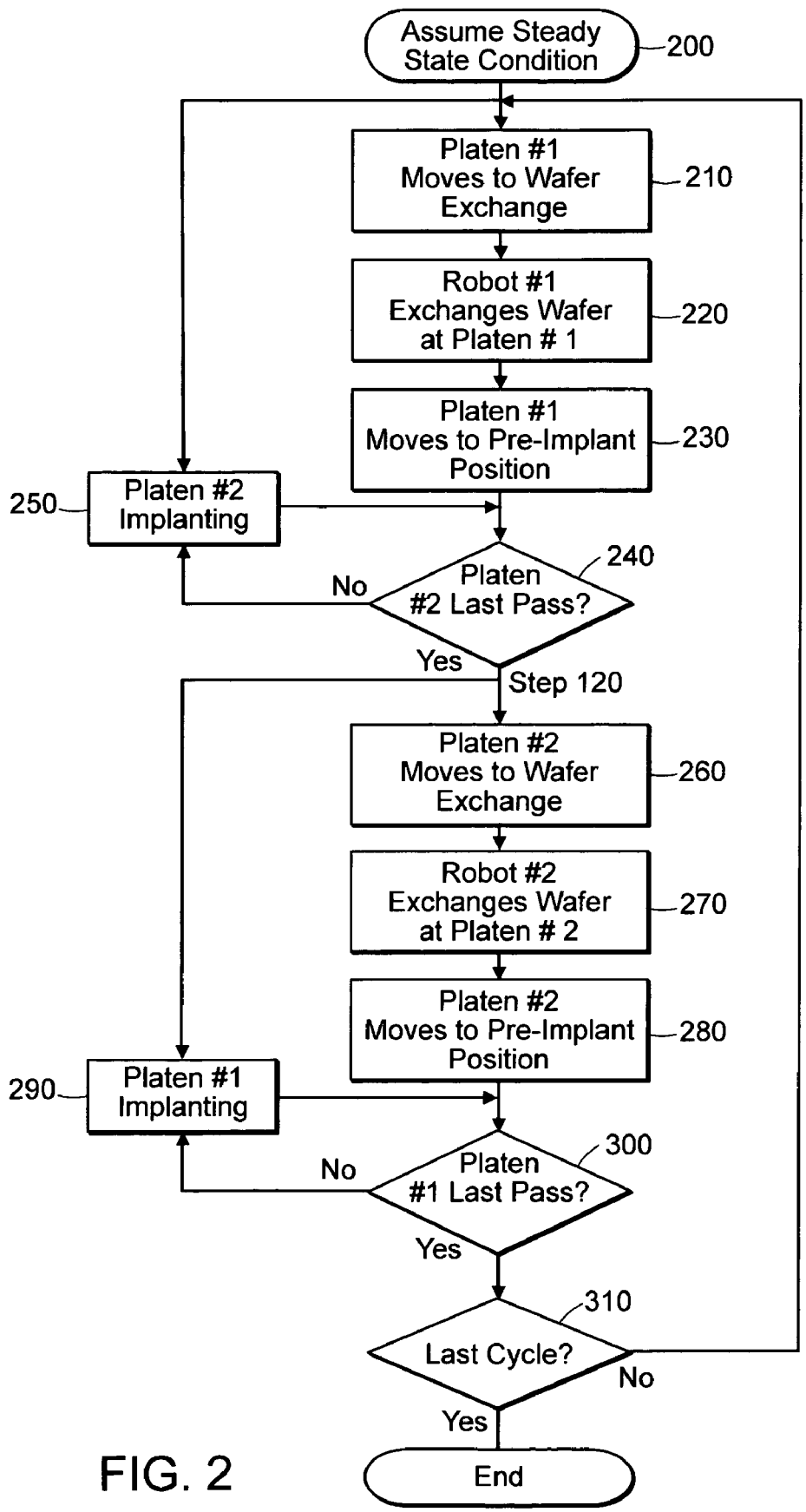
FIG. 2 is a flow chart illustrating processing steps performed by a dual platen serial ion implanter according to an embodiment of the present invention.

FIG. 2 illustrates a flow chart for one embodiment of the present invention utilizing a dual platen scan system. Step 200 of this flow chart represents processing in the steady state condition of a wafer on the first platen 130 completing its last pass of an implant and a wafer on the second platen 132 beginning the first pass of an implant. For simplicity, it is assumed that after either the first or second exchanger 120 or 122 exchanges a processed wafer for an unprocessed wafer at a respective platen, the processed wafer is then exchanged for an unprocessed wafer at the load lock 110. At step 210, a wafer on the first platen 130 moves to the wafer exchange position. During step 220, the first exchanger 120 exchanges the processed wafer with an unprocessed wafer at the first platen 130. The first scan system 140 moves the first platen 130 with the unprocessed wafer into a pre-implant position at step 230. Steps 210, 220, and 230 occur concurrently while the wafer on the second platen 132 is implanted at step 250. These steps and processes are generally represented in FIGS. 1(a)–1(d). The exchangers and scan systems for the platens have a sufficient number of degrees of freedom for positioning the wafer as required.

Next, the system controller 150 determines whether the wafer on the second platen 132 is completing the last implant pass at step 240. As one of the goals of the present invention is to have a wafer continuously scanning in the ion beam 102, the next wafer cannot be moved into the ion beam path 102 until the implanting process for the previous wafer is completing the last pass of a scan. For instance, the system controller 150 generates a signal to indicate when the last implant pass is completing for the wafer on the processing platen, which also indicates that the wafer on the other platen is ready for implanting. Multiple passes of the ion beam 102 across the wafer are often necessary to ensure sufficient and uniform implant dose. For example, in high throughput conditions, one scan (one scan equals two wafer passes through the ion beam) is required, however depending on the beam current and dose required, more than one scan may be required. If the wafer on the second platen 132 is not completing the last pass, then the wafer on the first platen 130 waits in the pre-implant position so as to not interfere with the on going implant process at step 250. The system controller 150 continually monitors the on-going implant at step 240.

As the wafer on the second platen 132 enters the last implant pass at step 240, the second platen 132 moves out of the ion beam path 102 and then the wafer on the first platen 130 moves into the ion beam path 102 immediately behind the wafer on the second platen 132 at steps 260 and 290. A distance sufficient for preventing collisions due to mechanical, control and timing variations separates the two wafers as they pass through the ion beam path 102. The wafer on the second platen 132 moves to the exchange position at step 260 simultaneous with the wafer on the first platen 130 being implanted at step 290. The second exchanger 122 will exchange the processed wafer with an unprocessed wafer in the corresponding step 270. The wafer on the second platen 132 and the corresponding second scan system 142 is moved to the pre-implant position at step 280 simultaneous with the ongoing wafer being implanted. These steps and processes are generally represented in FIGS. 1(e)–1(g).

As the wafer on the first platen 130 completes the last implant pass at step 300, the system controller 150 determines whether another cycle is to be repeated at step 310. If another cycle is to be repeated, the wafer on the first platen 130 moves out of the ion beam path 102 and the wafer on the second platen 132 immediately moves into the ion beam path 102 at step 210 and 250. Again, a distance sufficient for preventing collisions due to mechanical, control and timing variations separates the two wafers as they pass through the ion beam path 102. The wafer on the first platen 130 returns to the wafer exchange position at step 210 simultaneous with the wafer on the second platen 132 being implanted at step 250. The first exchanger 120 will exchange the processed wafer with an unprocessed wafer at the corresponding step 220. This cycle continues until all wafers from the load lock 110 are processed and the system controller 150 determines that no other cycles are to be repeated at step 310.

FIG. 1(b) illustrates the last implant pass of the first scan system 140 with the wafer on the first platen 130 as well as the first pass of the second scan system 142 with the wafer on the second platen 132. The first and second platens 130 and 132 are controlled to minimize the clearance between the wafers on the respective platens to maximize utilization of the ion beam 102. FIG. 1(b) generally corresponds to steps 210 and 250 in the flow chart of FIG. 2.

FIG. 1(c) illustrates the operation of the system according to the present embodiment after implanting of a first wafer is complete and the implanting of a second wafer is in process. The first exchanger 120 exchanges the processed wafer on the first platen 130 while the second wafer on the second platen 132 is implanted. FIG. 1(c) generally corresponds to steps 210, 220 and 250 in the flow chart of FIG. 2.

Figure 1E:
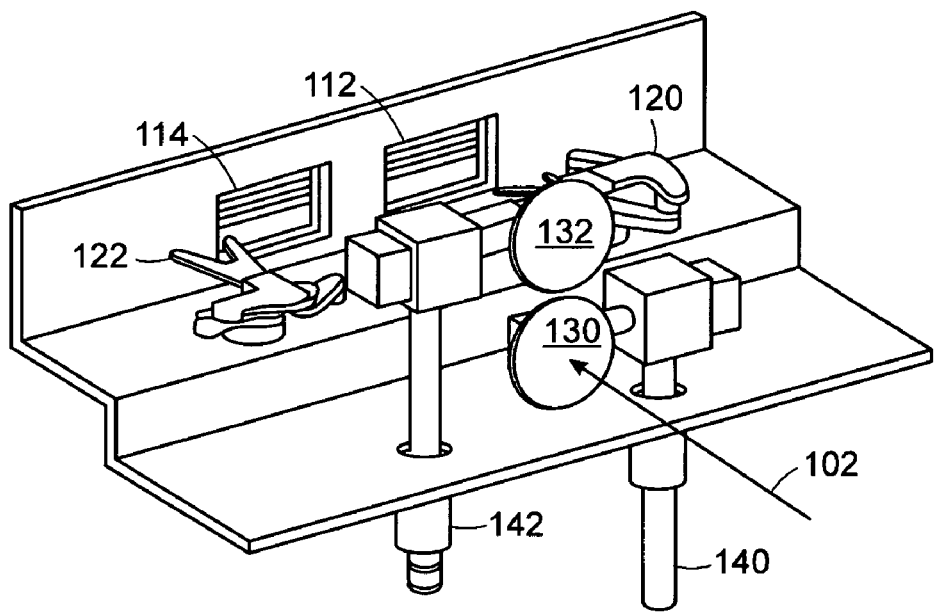
Figure 1F:
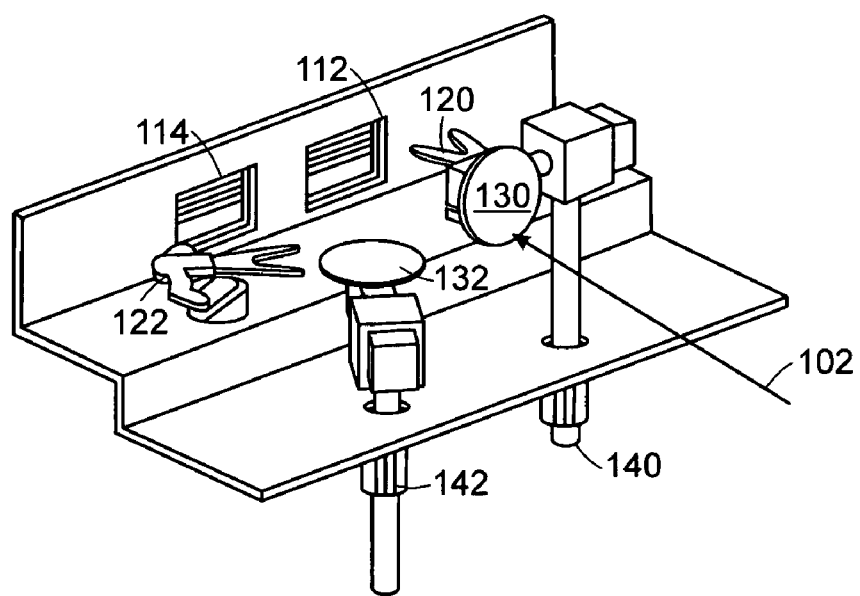
Figure 1G:
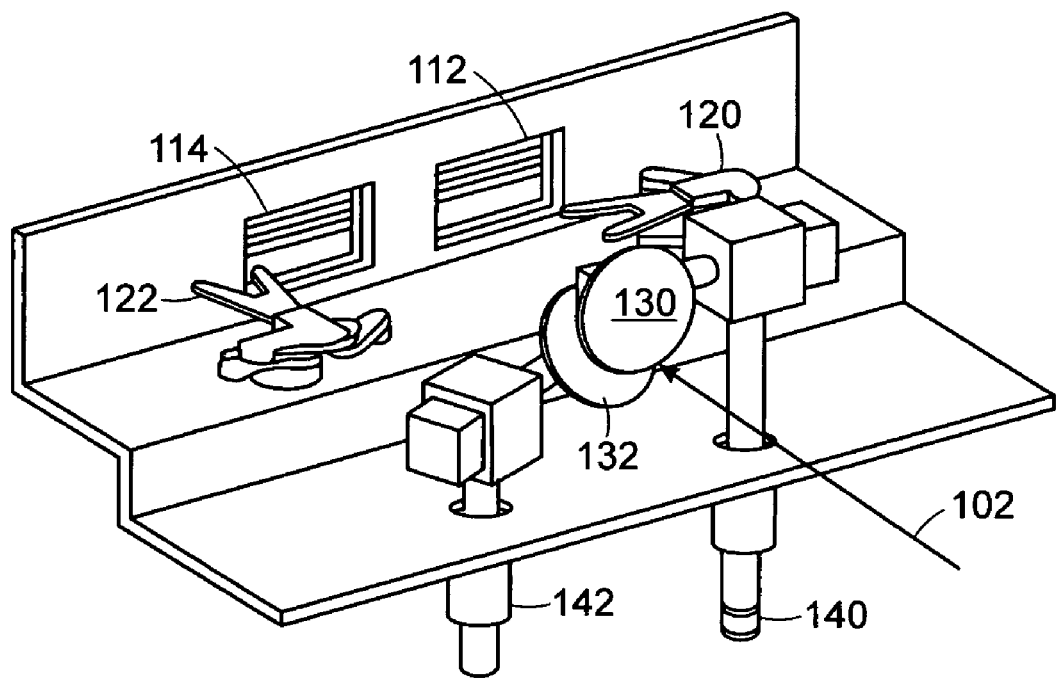

FIG. 1(d) illustrates a wafer on the second scan system 142 and the second platen 132 being implanted while the first scan system 140 and the first platen 130 move an unprocessed wafer to a pre-implant position. FIG. 1(d) generally corresponds to step 230 in the flow chart of FIG. 2.

FIG. 1(e) illustrates the last implant pass of a wafer by the second scan system 142 with the second platen 132 as well as the first pass of a wafer by the first scan system 140 with the first platen 130. The first and second platens 130 and 132 are controlled to minimize the clearance between the wafers on the respective platens to maximize utilization of the ion beam 102. FIG. 1(*e*) generally corresponds to steps 260 and 290 in the flow chart of FIG. 2.

FIG. 1(*f*) illustrates a wafer exchange by the exchanger 122 at the second platen 132 while the wafer on the first platen 130 of the first scan system 140 is being implanted. FIG. 1(*f*) generally corresponds to steps 260 and 290 in the flow chart of FIG. 2.

FIG. 1(*g*) illustrates the second scan system 142 with an unprocessed wafer on the second platen 132 in the pre-implant position. FIG. 1(*g*) generally corresponds to step 280 in the flow chart of FIG. 2. As indicated in the flow chart of FIG. 2, these steps will continue to repeat until all wafers are processed.

Although the description above has been directed to a system including two wafer exchangers and two scan systems, it will be appreciated that the present invention may utilized any number of wafer transfer robots, scan systems and load locks. It may be advantageous to utilize two or more wafer transfer robots and scan systems to realize increased speed requirements so that wafers are continuously present to the beam. Such variations of the system described in FIGS. 1(*a*)–1(*g*) and 2 may be realized by one skilled in the art. Although the methods are systems have been described relative to specific embodiments thereof, they are not so limited. Obviously many modifications and variations may become apparent in light of the above teachings. Many additional changes in the details, materials, and arrangement of parts, herein described and illustrated, can be made by those skilled in the art. Accordingly, it will be understood that the present invention is not to be limited to the embodiments disclosed herein, can include practices otherwise than specifically described, and are to be interpreted as broadly as allowed under the law.

What is claimed is:

1. An ion implantation apparatus comprising:
   a plurality of scan systems for scanning workpieces in an ion implanting beam;
   a plurality of exchangers for moving the workpieces to and from the scan systems; and
   a controller for positioning one of the workpieces for scanning in the ion implanting beam by one of the scan systems, sensing completion of processing for the one workpiece and simultaneously positioning another of the workpieces for scanning in the ion implanting beam by another of the scan systems so that the workpieces are continuously presented to the ion implanting beam.

2. An ion implantation apparatus according to claim 1, wherein the scan systems horizontally scan the workpieces relative to the ion implanting beam.

3. An ion implantation apparatus according to claim 1, wherein the scan systems vertically scan the workpieces relative to the ion implanting beam.

4. An ion implantation apparatus according to claim 1, wherein the scan systems scan the workpieces at a predetermined angle relative to the ion implanting beam.

5. An ion implantation apparatus according to claim 1, wherein the ion implanting beam is a spot beam.

6. An ion implantation apparatus according to claim 1, wherein the ion implanting beam is a ribbon beam.

7. An ion implantation apparatus according to claim 1, wherein the plurality of scan systems comprise at least two scan systems and the plurality of exchangers comprise at least two robots.

8. An ion implantation apparatus according to claim 7, wherein two wafer exchange robots correspond to each of the scan systems.

9. An ion implantation apparatus according to claim 1, further comprising a load lock for storing a plurality of the workpieces.

10. An ion implantation apparatus according to claim 1, wherein the plurality of scan systems comprise dual arm robots.

11. An ion implantation apparatus according to claim 1, wherein the controller positions a predetermined gap between the workpieces when the one workpiece is replaced with another of the workpieces during the continuous presentation of the workpieces to the ion implanting beam.

12. An ion implantation apparatus according to claim 1, wherein the controller introduces a predetermined delay between the workpieces during the continuous presentation of the workpieces to the ion implanting beam.

13. A method for ion implanting workpieces comprising the steps of:
   scanning workpieces in an ion implanting beam;
   moving the workpieces to and from the step of scanning;
   positioning one of the workpieces for scanning in the ion implanting beam;
   sensing completion of processing for the one workpiece; and
   simultaneously positioning another of the workpieces for scanning in the ion implanting beam so that the workpieces are continuously presented to the ion implanting beam.

* * * * *